United States Patent [19]
Dekker et al.

[11] Patent Number: 5,325,367
[45] Date of Patent: Jun. 28, 1994

[54] MEMORY DEVICE CONTAINING A STATIC RAM MEMORY THAT IS ADAPTED FOR EXECUTING A SELF-TEST, AND INTEGRATED CIRCUIT CONTAINING SUCH A DEVICE AS AN EMBEDDED STATIC RAM MEMORY

[75] Inventors: Robertus W. C. Dekker, Eindhoven; Aloysius P. Thijssen, Pijnacker; Franciscus P. M. Beenker; Joris F. P. Jansen, both of Eindhoven, all of Netherlands

[73] Assignee: U.S. Philips Corporation, New York, N.Y.

[21] Appl. No.: 752,166

[22] Filed: Aug. 22, 1991

Related U.S. Application Data

[63] Continuation of Ser. No. 376,066, Jul. 5, 1989, abandoned.

[30] Foreign Application Priority Data

Jul. 13, 1988 [EP] European Pat. Off. ........ 88201501-9

[51] Int. Cl.⁵ .............................................. G11C 29/00
[52] U.S. Cl. .................................. 371/21.1; 371/21.3; 371/22.3; 371/22.5
[58] Field of Search ..................... 371/21.3, 22.3, 22.4, 371/22.5, 21.1

[56] References Cited

U.S. PATENT DOCUMENTS 3,961,251  6/1976  Hurley et al. ................... 371/21.1
4,701,920 10/1987  Resnick et al. ................. 371/22.5
4,903,266  2/1990  Hack .............................. 371/21.2

OTHER PUBLICATIONS

Jain, S. et al. "Built-in Self Testing of Embedded Memories", *IEEE Design & Test of Computers*, Oct. 1986, No. 5, vol. 3, pp. 27-37.
Sarkany, E. et al., "Minimal Set of Patterns to Test RAM Components", *1987 International Test Conference*, pp. 759-764.
Avra, L., "A VHSIC ETM-Bus-Compatible Test and Maintenance Interface", *1987 International Test Conference*, pp. 964-971.
Little, R. et al., "Built-In Test-Requirements, Issues and Architectures", *TI Technical Journal*, Jul.-Aug. 1988, pp. 111-122.
Daniel, W. et al., "VHSIC Testability:An IC-to System-Level Implementation", *TI Technical Journal*, Jul.-Aug. 1988, pp. 123-131.
Varma, P., et al., "On-Chip Testing of Embedded RAMs", *Proc. Custom Integrated Circuits Conf.*, 1984, pp. 286-290.
Sun et al., "Self-Testing of Embedded RAMs", International Test Conference 1984 Proceedings, Oct. 16-18, 1984, Paper No. 4.3, pp. 148-156.

(List continued on next page.)

*Primary Examiner*—Stephen M. Baker
*Attorney, Agent, or Firm*—Bernard Franzblau

[57] ABSTRACT

A memory device that contains a static RAM memory is provided with data input and data output registers, an address register, and a control register for storing various control signals. The RAM has three principal modes:
  a. in a normal mode, all registers are accessible externally so that the memory may fulfill its standard function,
  b. in a scan-state, all the cited register constitute a synchronous shift register that may be serially written with a test pattern and serially read with a result pattern; in this way the memory may be subjected to a test according to the scan test principle,
  c. in a self test state the communication with the outer world is shut off, the address register counts through successive addresses, the memory is cycled through read-modify or read-modify-read operations, and the data read is conversed to a signature pattern for subsequent scan-out. In this way a quasi stand-alone test facility is realized. Various additional features may be implemented.

16 Claims, 8 Drawing Sheets

OTHER PUBLICATIONS

Digest of Papers, 1981, International Test Conference, 27th–29th Oct. 1981 pp. 44–48, IEEE, N.Y., S. Winegarden et al,: "Paragons for Memory Test".

Electronic Design, Jun. 14 1984, pp. 301–304, 306, 308 Hasbrouck Hts., N.J. B. Threewitt: "RAM's On-Chip Registers Build Simple Control Stores That . . . ".

IEEE Transactions on Computers, vol. C-27, No. 6, Jun. 1978, pp. 572–576, IEEE N.Y., R. Nair et al "Efficient Algorithms for Testing Semiconductor . . . ".

Whetsel, L., "Standard Test Port and Cells Provide An ASIC Testability Toolkit", *TI Technical Journal*, Jul.-Aug. 1988, pp. 35–43.

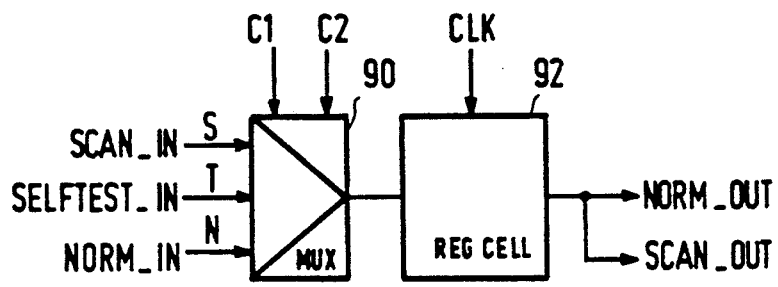
FIG. 4b
FIG. 4a
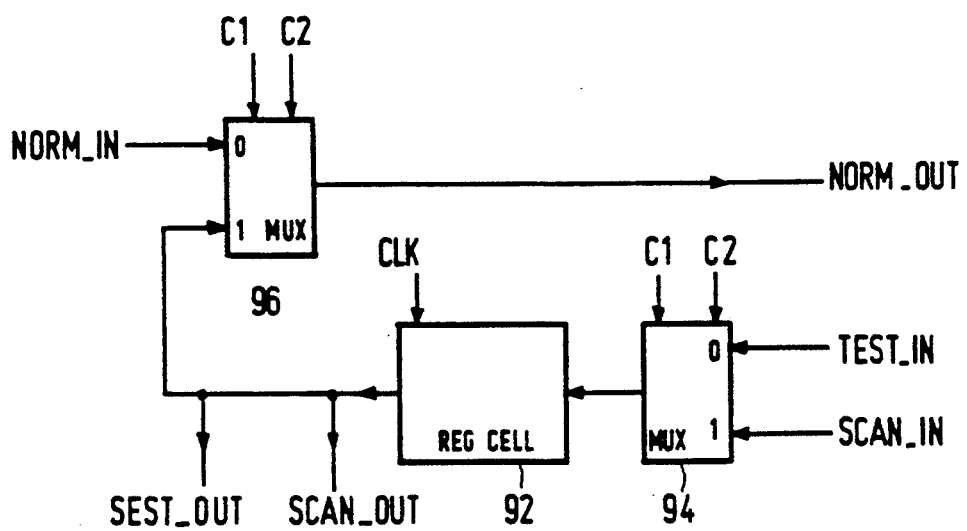
FIG. 5

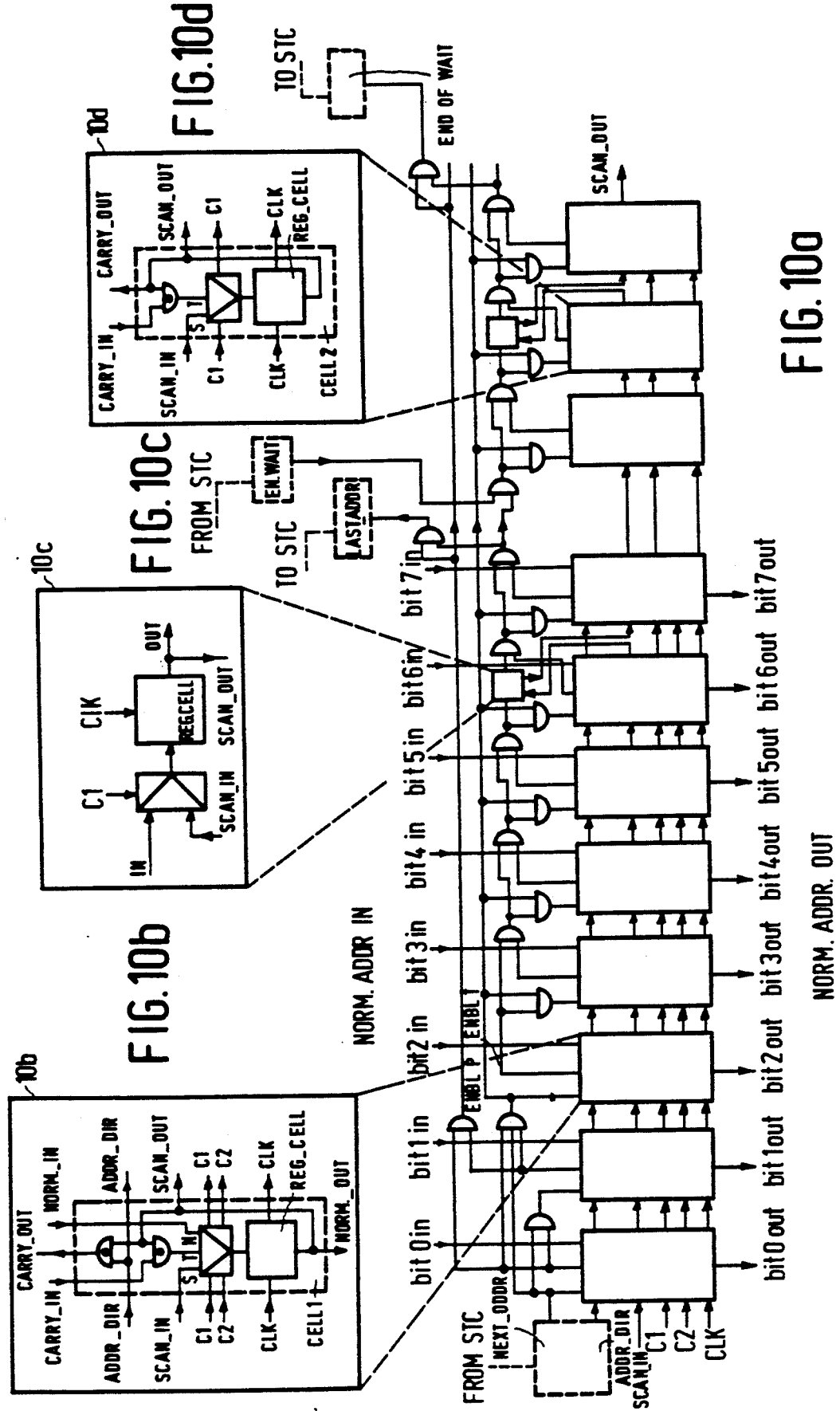

MEMORY DEVICE CONTAINING A STATIC RAM MEMORY THAT IS ADAPTED FOR EXECUTING A SELF-TEST, AND INTEGRATED CIRCUIT CONTAINING SUCH A DEVICE AS AN EMBEDDED STATIC RAM MEMORY

This is a continuation of application Ser. No. 07/376,066, filed Jul. 5, 1989 now abandoned.

BACKGROUND OF THE INVENTION

The invention relates to a memory device containing a static RAM memory, and thereto connected an address register, a data input register, a control register, all these registers having externally accessible functional interconnections for information communication, said RAM memory furthermore having a functional data output. In particular, such memory should be easily testable. Conventionally, such testing is effected by writing a predetermined data pattern on a predetermined address location. At any later instant the data is read out again. The test proper consists of comparison operations between the data pattern read out and the data that should have been written into that location. If a sufficient number of correct comparisons have been found, the memory is considered as good. Testing of such a memory device as an embedded memory has been described in literature. The following publication is being cited as relevant art: Z Sun et al, Self-testing of embedded RAM's, IEEE 1984 International Test Conference Proceedings, Proceedings pages 148–156, Paper 4.3.

SUMMARY OF THE INVENTION

Among other things, it is an object of the present invention to provide a memory device according to the preamble which is adapted for embedded as well as for stand-alone use, which realizes a selftest, whereof the test provisions lend themselves to easy parametrization, wherein the number of test patterns and therefore the required test time is limited and which after initialization of the test can independently execute further testing operations. According to a first aspect this object is realized in that the invention is characterized in that said functional data output is provided with a data output register, in that all said registers constitute respective parts of a serially activatable test scan chain means, and first control means being provided for activating said memory device alternatively in a scan-state, an operational state, and a self-test state; in said scan state said test scan chain means being operative as a least one serial shift register, in said operational state at least said address register, said data input register, and said control register being operatively coupled to the memory, and in said self-test state said address register, said data input register and said control register being operative for under absence of any information communication via any information input of the memory device, forming successive data test patterns and address test patterns and said data output register being operative for receiving successive data result patterns and having conversion means for then converting successive data result patterns to a signature pattern, and furthermore in that any said shift register has a serial input for receiving preset information and a serial output for outputting said signature pattern, data contained therein.

Various other objects are as follows:

1. The test algorithm implemented by the self-test machine must have excellent fault detection capabilities.
2. The structure of the self-test machine is independent of address and data scrambling.
3. The self-test machine may generate data backgrounds on-chip if required and is therefore suitable for both bit oriented and word oriented SRAMs.
4. It has an option for a data retention test.
5. It is suitable for both embedded SRAMs and stand-alone SRAMs and fits perfectly in a boundary-scan environment. Such environment, in particular, has been disclosed in Netherlands patent Application 8502476, U.S. Pat. No. 4,791,358, herein incorporated by reference.
6. The additional logic circuitry necessary for effecting the self-test can be tested itself by means of the scan test principle; self-test as herein defined is the test strategy wherein the numbers of data input cycles and data output cycles are appreciably smaller than the number of test cycles.
7. Due to the regular and symmetric structure of the test algorithm, inter alia, with respect to the various significance levels in data and address quantities, the silicon overhead is kept small (about 3% for a 16k synchronous SRAM). On the other hand this is a trade-off, in that additional hardware could have led to a faster test.

MEMORY FAULT MODEL

The following faults may be distinguished, by way of example.

A memory cell is said to be stuck-at if the logic value of the cell cannot be changed by any action on the cell or any influence from other cells. A cell is called stuck-at-0(1) if its read value is always 0(1).

A memory cell is said to be stuck-open if it is not possible to access the cell. The cause of a stuck-open fault is that the cell's pass transistors are always opened.

A cell with a transition fault fails to undergo either of both transitions $0 \to 1$ or $1 \to 0$.

A memory cell i is said to be state coupled to another memory cell j, if cell i acts as being stuck-at a certain value $x(xE\{0,1\})$ only if cell j is in one defined state $y(yE\{0,1\})$. In other words: if cell j is in one defined state the state of cell i is defined and can be read, but not be changed in a write action. This does not necessarily means cell j is also state coupled to cell i.

A memory cell i is said to be transition coupled to cell j if a transition $x \to \bar{x}(xE\{0,1\})$ forces a transition $y \to \bar{y}$ $(yE\{0,1\})$ of cell i. This need not imply cell j is also transition coupled to cell i.

The translation of electrical/electronic faults to the above functional faults depends on circuit implementation and is not considered further.

SELECTIVE FURTHER ASPECTS AND ADVANTAGES

Advantageously, the test starts with an initialization pattern which is synchronously converted to a succession of sequel patterns, each of them leading to a result pattern, and each result pattern contributing to the signature. This self-sequence obviates the need for continual control at a higher organizational level. The preliminary signature is each time held in a latch type organization, which represents an advantageous synchronous organization. A set of test patterns may have first a maximum number of (1-0) transitions, thus either an 0-1-0-1 . . . or a 1-0-1-0 . . . pattern, whereafter this pattern is replayed by projecting half of the bits thereof each to two bits of a projected pattern; the latter may have fewer (1-0) transitions between successive bit patterns. Further replays lead at last to a bit pattern with a uniform bit value. For n bits, a total of $2 \log n + 1$ patterns are necessary, which is an advantageously low number. Advantageously, also the test control provisions and the memory itself are directly scan-testable: this means that internal bistable elements may also be interconnected into a serial scan chain for storing test/result patterns. Although the probability of faulty control circuitry is by itself low (because of relatively small area), these provisions allow for fast testing of specific control means, and fast testing of predetermined memory device parts. Advantageously the memory contains a wait counter in addition to its address counter for self-reliantly counting down a retention test waiting time. Static RAMs should have a reasonable data retention time. Testing thereof raises the expected reliability of the memory device. Advantageously, the control is effected by a finite state machine. Realization thereof by ROM, programmable logic array, wild logic or other means will be shown to be realizable in an unexpected low number of logic control terms. Advantageously, for N different addresses, the same memory hardware would allow for either according to a 9N test sequence method or according to a 13N address test sequence method. This represents a quite low number of accesses for each location, that, moreover, is linear in the number of locations only.

The invention also relates to an integrated circuit containing a testable memory device according to the above, that in said operational state is operatively connected to at least one further data processing subsystem on said integrated circuit. The testability of the now embedded RAM-memory greatly raises the reliability of the overall circuit.

Further advantageous aspects are recited in dependent Claims.

BRIEF DESCRIPTION OF THE FIGURES

The invention hereinafter is being explained with respect to the accompanying figures, wherein

FIG. 4a shows a modified register cell for use in FIG. 3;

FIG. 4b shows a table associated with FIG. 4a;

FIG. 5 shows a further modification for a stand-alone RAM-memory;

FIG. 10a, 10b, 10c, 10d show an exemplary circuit realization of an eight bit address generator counter and three bit additional wait counter; plus particularly amended register cells for use therein;

FIG. 11 shows an exemplary circuit realization of an eight bit signature generator;

FIG. 11a shows a modified register cell therefor.

ORGANIZATION OF A PREFERRED EMBODIMENT

Figure 1:
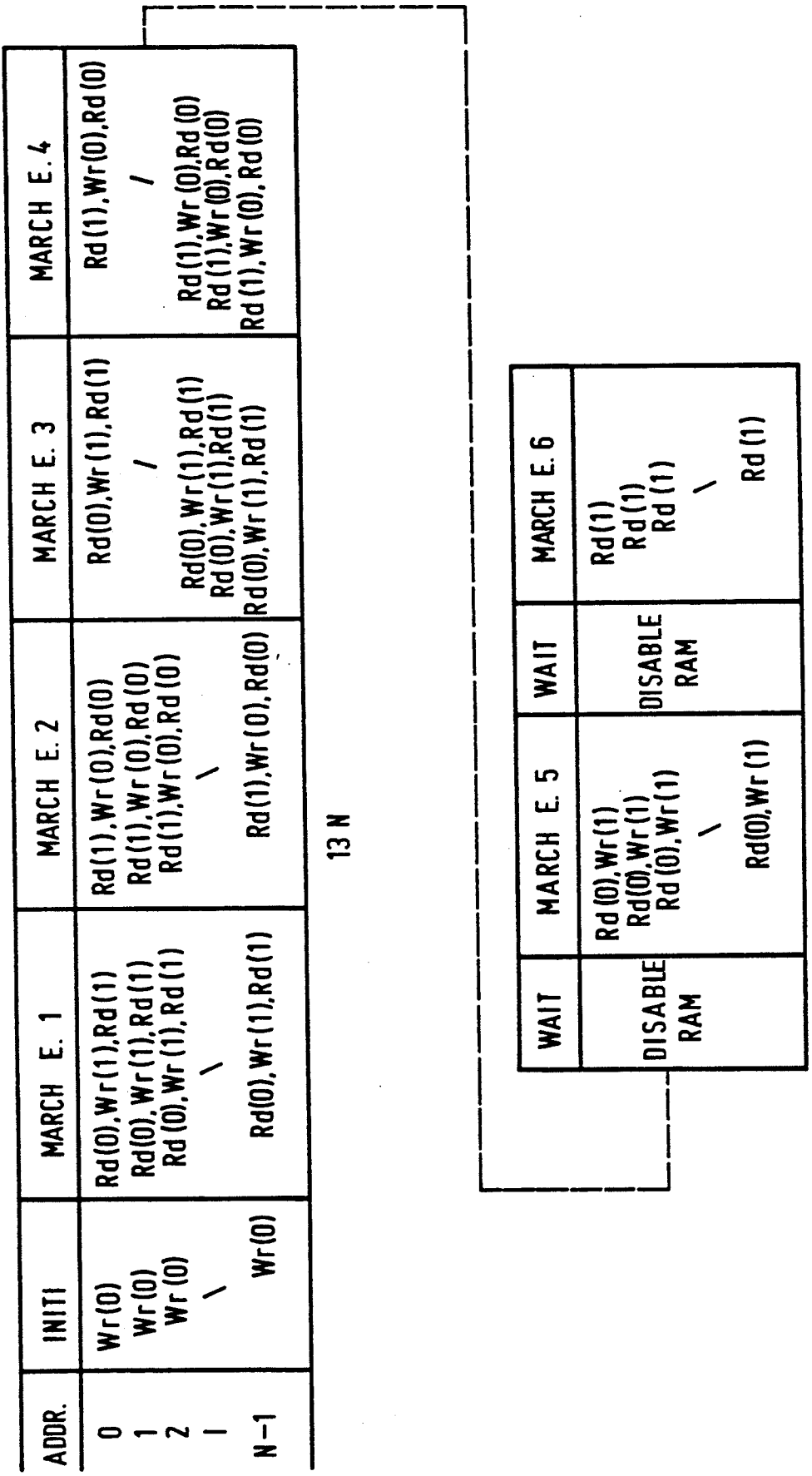
FIG. 1 shows a 13N test algorithm with data retention test.

FIG. 1 shows a 13N test algorithm with data retention test. N is the number of address $0 \ldots N-1$ featured in the first column. The second column gives the initialization, wherein each address in succession is written with data 0. The address sequence is effected by incrementing the addresses each time by $+1$. Likewise, the third and fourth columns have increasing addresses. On the other hand, the fifth and sixth columns have decreasing addresses; incrementing by $-1$.

This test is based on a realistic fault model, including stuck-at faults, stuck-open faults, transition faults, coupling faults and data retention faults. In the figures, a RAM WRITE instruction is indicated by Wr and a READ instruction by Rd. The orientation of the data is given in parentheses. The RAM address at which the instruction is executed is shown in the first column of the figure. The required wait time for the data retention test largely depends on the design. In our design we use 50 msec as an example. A bit oriented SRAM will be thoroughly tested with tis test algorithm. In a test of a word oriented SRAM however, each address location must be written and read for a complete word. In order to detect coupling faults between cells at the same address, several data words, called data backgrounds, are required during the memory test.

Figures 2, 3:
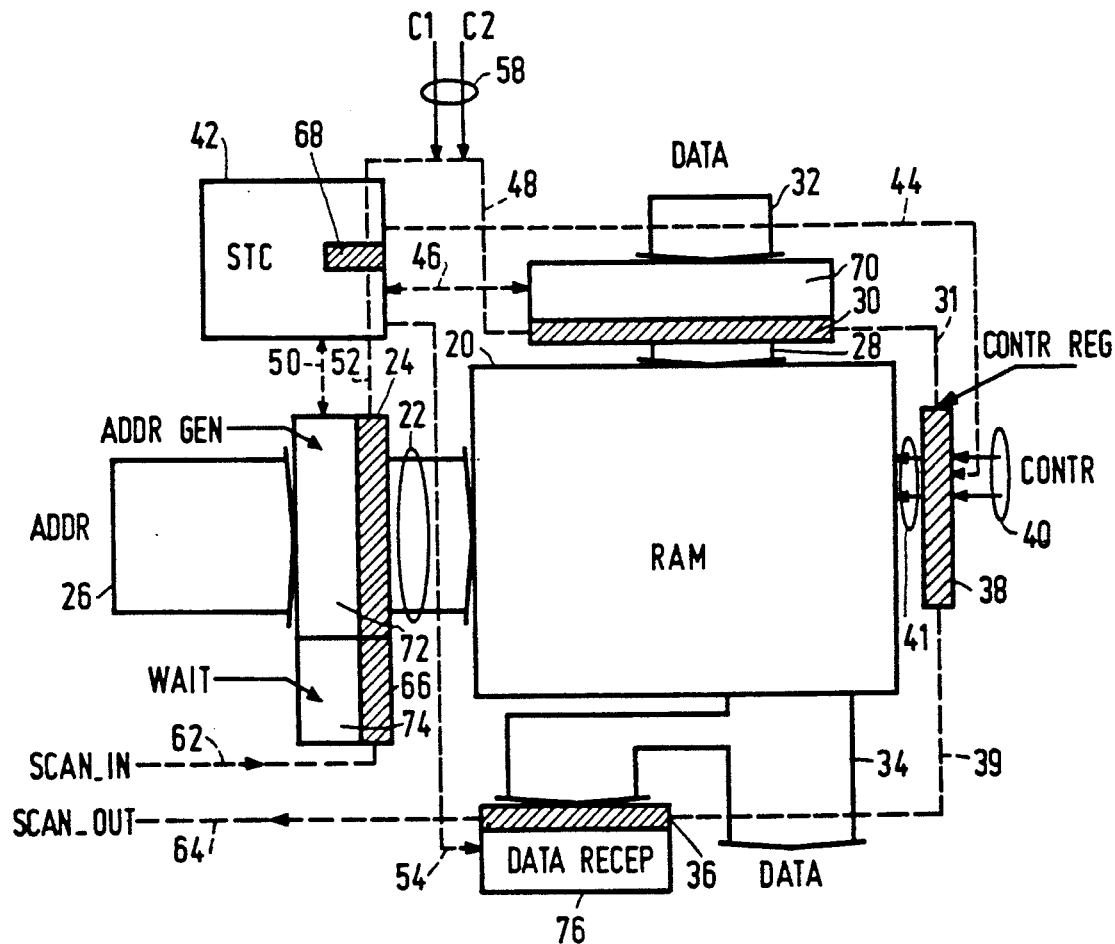
FIG. 2 shows data backgrounds for a 16-bit wide SRAM test.
FIG. 3 shows a global architecture of a memory device according to the invention.

FIG. 2 shows data backgrounds for a 16-bit wide RAM. In the first data background there is a 0-1 transition between every pair of successive bit positions. Conversion to the next four data backgrounds goes as follows: for bit positions $0 \ldots i \ldots n-1$, bit i is copied onto bit positions $2i$ and $(2i-1)$, for the next data background. For 16 bits after four successive conversions an all zero data background is reached. The lower half of the figure has data backgrounds that are bitwise inverted with respect to a corresponding data background in the upper half. More generally, the above copying or projecting may be done in various ways, in that half of the bits are each projected on two bit positions. In certain set-ups, the copying may be done with an inversion. The scheme shown above appears to be most easily implemented.

An extensive self-test for a word oriented SRAM will be as follows: First the 13N test is run with the first data background, then with the second data background, etcetera. Finally both the 13N test and the data retention test are run with the last data background.

The data retention test implies two waiting intervals in both seventh and ninth columns. During these intervals the memory is disabled and data content should therefor, remain unchanged. The method can be made faster in that the direct-read-after-write feature would not be used. This reduces the method to a 9N-method. The patterns of the second half of FIG. 2 are realized by inversion as shown hereinafter. Inversion is effected before conversion. The retention test is done only for two backgrounds: all-zero, and all-one-data patterns, respectively. Alternatively, any pattern set wherein for each cell retention is tested both for a -one-and for a -zero- would do.

SET-UP OF A PREFERRED EMBODIMENT

FIG. 3 shows a global architecture of a memory device according to the invention. The memory matrix contains a row- and column-wise array of memory cells that may contain conventional circuitry. There is an address input 22 fed by address register 24, which via external address-path 26 may receive addresses from a source not shown. There is a data input 28 fed by data register 30, which via external data path 32 may receive data from a data source not shown. Alternatively, the data could be receivable from the external source asynchronously in that register 30 be transparent or in any other adequate way. There is an external data output 34 in parallel with data output register 36. Alternatively, the data output register is in series with data output 34. Control of the register in normal use could render it transparent. There is a control register 38 that receives external control signals (read, write, chip-select, and the like) on external path 40 and emits control signals for the matrix on lines 41. There is a self-test-controller 42 that contains register cell means 68, and which communicates along control signal lines 44, 46, 50, 54 with various other subsystems. In general, during the selftest the memory operates in synchronous mode, while all registers are clock-controlled. In normal use, the memory could also operate asynchronously, in that any necessary register-hardware be off-chip, most or all external accesses being transparent. The S-RAM as shown may represent an internal part of a complicated integrated circuit, for example a microprocessor, modem or special purpose device for which it acts as embedded memory. Such a device may comprise an arithmetic and logic unit (ALU), multiplier, barrel shifter, wild logic, programmable logic array, registers, input-output circuitry, A/D-D/A converters, bus organizations and others. These may feed the memory with addresses, data and control signals, and receive data from the memory. Alternatively, only a selection of these features may be present in that the remaining data/address and control connections are directly connected to associated bonding pads of the chip. Inasmuch as these subsystems may be conventional, no further disclosure is deemed necessary. On the other hand, the memory shown may be a stand-alone memory in that external connections would directly lead to associated bonding pads.

For testing objects the following elements have been provided: there is formed a serial scan chain according to a known principle that contains the hatched elements. The interconnecting scan line has input 62, interconnecting portions 52, 48, 31, 39 between the various registers, and serial output 64. All registers so interconnected may be controlled as a serial shift register under control of control signals C1, C2 on line 58, to be discussed hereinafter. Input 62 and output 64 may be connected to a host machine not shown. The host may furthermore drive lines 58 with appropriate control signals. Data input register 30 has been provided with a data generation mechanism for modifying data patterns; it exchanges control signals with control subsystem 42. Address register 24 has additional provisions 72 for constituting a counter. Register 66 in corresponding manner has provisions 77 for constituting a waiting counter for executing a data retention test. Provisions 72, 77 exchange control signals with control sub-system 42 via line 50. Data output register 36 has provisions for producing from a sequence of successive data result patterns a signature pattern. The signature pattern may be transferred via line 64. The latter provisions receive control signals via line 54. Finally, control subsystem 42 may transmit control signals on line 44 for controlling the test-associated modes. In similar way, the scan chain sequence among the various registers may be different. Alternatively, in case of long scan chains they may be broken up into any feasible number of subchains.

FIG. 4 shows a modified register cell for use in several places in FIG. 3. The register cell contains a storage part 92 and an input multiplexer 90, the latter receiving two control signals C1, C2. The function of these control signals is shown in an associated table set forth in FIG. 4b as follows: for C1=C3=0 the normal input N is activated, if C1=0, C1=1, the self-test input T is activated, and if C1=1 and C2 is don't care the scan input S is activated. The storage part 92 is activated by a clock CLK. The output signal from the storage part may be used for normal out, for scan-out, and if required for self-test out. -Normal- implies the standard memory operation. -Scan- implies that the register cell constitutes part of a shift register of register cells. -Test- will be discussed hereinafter. If the -Test- provision is not necessary, the associated connections need not be present.

FIG. 5 shows a further modification of a register cell for use in a stand-alone memory. In this case two multiplexers 94, 96 have been provided. The first is a reduced version of multiplexer 90 in FIG. 4, the second is used only to discriminate between -normal- and -not-normal- situation. In the normal situation no storage is effected. The -test-out- and -scan-out-signals are present at the storage cell output.

DESCRIPTION OF THE EXECUTION PROCESS

Figure 7:
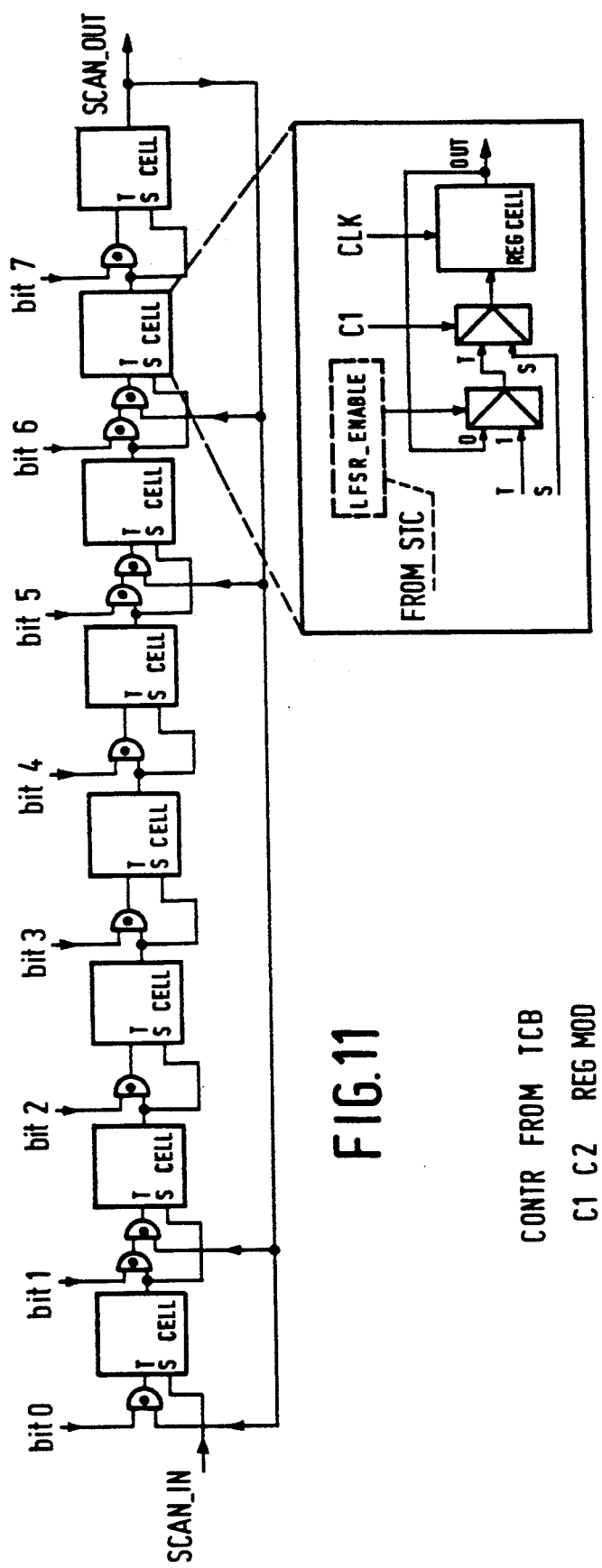
FIG. 7 shows a table of the various modes of the controller.

In this respect FIG. 7 shows the sequence of modes of the controller. First, with C1=C2=0, the RAM is operated in normal mode. Next, for C1=C2=1, all registers are initialized, except those in the controller part. Then, after C2 goes to 0, the self-test runs, until it stops independently at completion. Thereafter C2 goes to 1 again and the test results inclusive of the signature pattern, may be output serially. Finally, both control signals go to zero and the circuit is free again for normal mode operation.

Figure 6:
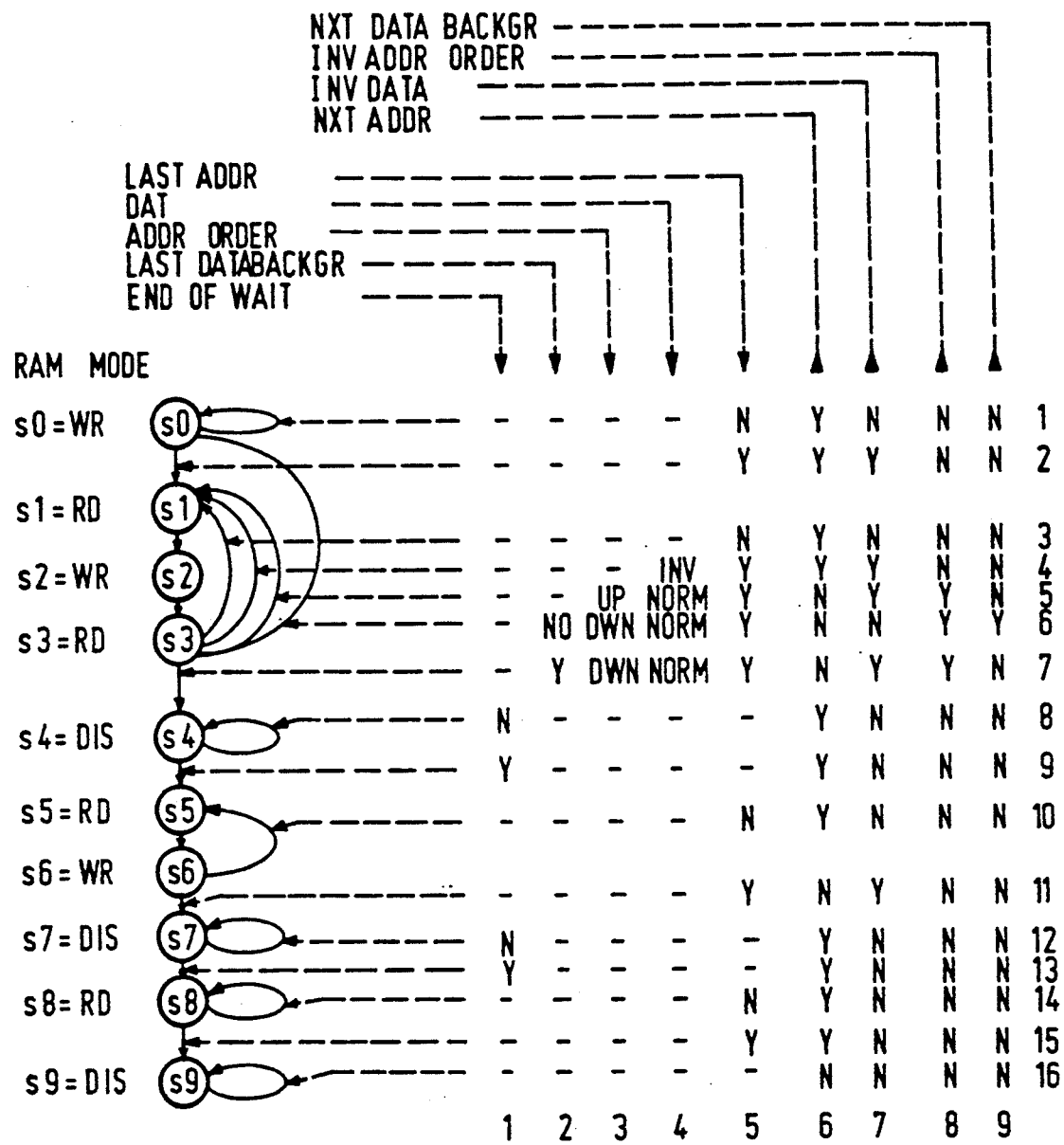
FIG. 6 shows a self-test-controller state diagram.

FIG. 6 shows a self-test controller state-diagram for executing the 13N test of FIG. 1. The regular structure of the test method resulted in a state diagram of low complexity and thus in a low complexity of the self-test-controller.

Each state is indicated by a circle. The first state S0 executes the second column in FIG. 1 and therefore loops continuously, each time generating the next address (column 6). The data background is unchanged (column 9), the address order is not inverted (column 8), the data is not inverted (column 7), and the last address has not been reached (column 6). If the last address is reached, the system exits (cf. column 7) to the next state S1. The data is inverted (column 7), the address is incremented, so that the first address is reached again. Next, the present address is read out (state S1) written with the next data (state S2) and read again (state S3). Thereupon the systems reverts to state S1 while going to the next address (line 3, column 6) without further change and the cycle repeats (S1, S2, S3). If the last address is found (line 4, column 5), the data is inverted (column 4), the address is incremented (column 6) and the whole range of addresses is cycled again. This operation corresponds to executing the fourth column of FIG. 1. After operating on all addresses, the fifth row is reached. Herein, the data is inverted (column 7), the address order is inverted (column 8), the address order is -normal- (column 3), that is: no further change is effected, and no further inversion of the data is effected (column 4). When the last address is reached, the system goes to line 6. Herein, the address order is inverted (column 8), the next data background is written (column 9), the address order is downward (column 3). As long as the last data background has not been reached, the output from state S3 is now towards state S0, wherein the new data background is successively written into all memory addresses. Next, the repeated cycling through states S1, S2, S3 is effected again. Upon attainment of the last data background, however, the system exits va column 7 to state S4. Herein, the address counter is activated (column 6), but the memory itself remains disabled. When the waiting time ends (column 1, line 9), the system goes to state S5, wherein the first address is read. Next in state S6, new data is written and these two states are traversed once for each different address. When the last address has been reached again (row 11), the system goes to state S7. Here again a waiting time is effected for testing the data retention. There after in state S8 all memory positions are read and after attainment of the last address, the system goes to state S9 wherein the memory is disabled and the test is over. The only thing remaining is the output of test evaluation information, including the signature pattern, which is not shown here.

PREFERRED EMBODIMENTS OF VARIOUS TEST SUB-SYSTEMS

Figure 8:
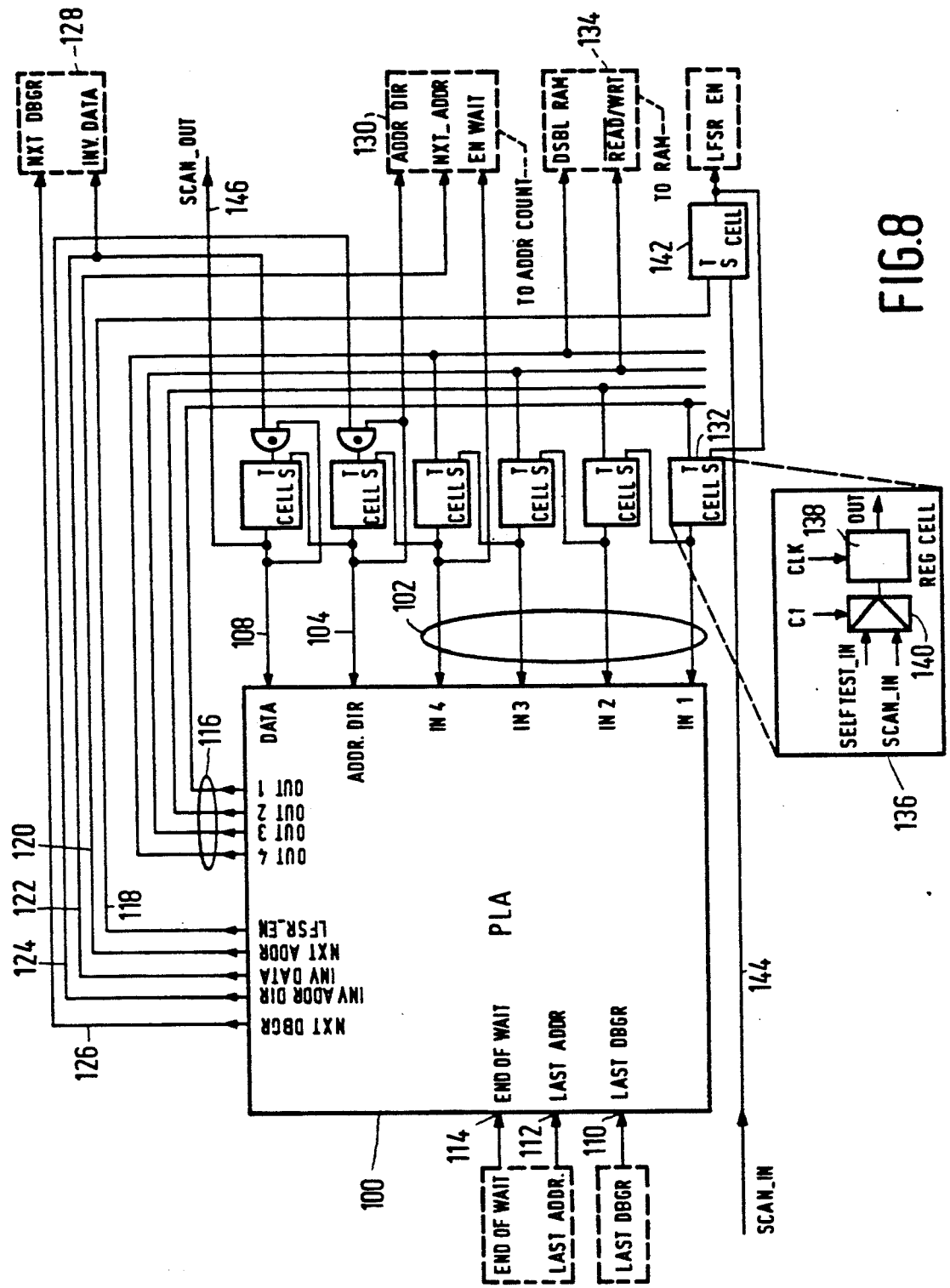
FIG. 8 shows an exemplary circuit realization of the self-test controller.

FIG. 8 gives an exemplary circuit realisation of the self-test controller (42C). The programming is done in programmable logic array PLA 100 of sufficient storage capability. There are nine inputs and nine outputs. The inputs are the following: state inputs 102 that may define the ten states shown in FIG. 6 (S0 ... S9). Input 104 signals the address incrementation direction. Input 108 signals the inverted or normal situation with respect to the data (column 4 in FIG. 6). Input 110 signals the attainment of the last data background: the signal in question is produced by the data generator to be discussed hereinafter; the block indicates a steady-state signalization. Input 112 signals the attainment of the last address of a cycle through all memory addresses. Input 114 signals the completion of the retention test waiting time. Signals 112, 114 are produced by the address-/waiting time counter to be discussed hereinafter; the block indicates a steady state realisation.

The outputs of the PLA are the following: Outputs 116 signal the next state of the system to be attained, these are coupled back to inputs 102 via holding register cells. Output 118 activates the LFSR (linear feedback shift register) to be discussed hereinafter for generating a signature pattern. Output 120 signals the next address to be activated. Output 122 signals that the data is to be inverted. Output 124 signals that the address incrementation direction is to be inverted. Output 126 signals that the next data background is to be activated. The output signals are processed as follows: outputs 122, 126 are connected to the data generator symbolized by block 128. Output 120 is connected to the address counter symbolized by block 130. State outputs out 4, out 3 are connected to the RAM memory, symbolized by block 134 for therein controlling enable/disable and write/-read modes, respectively. The local inputs (102, 104, 108) are produced by flipflops 132, that have a set-up shown in detail in block 136: the register cell proper 138 is a data flipflop controlled by the clock clk; it is preceded by a 2:1 multiplexer 140 that is controlled by control signal C1 discussed hereabove. It has two inputs for the self-test input and the serial scan input, respectively. Element 142 is a further such cell, fed by PLA output out 1. Cells 142, 132 are connectable in a serial shift register for executing a scan test, as being fed by input 144 and outputting via output 146. Together they realize the hatched part 68 of controller 42 in FIG. 3. The output of element 142 is connected to the signature forming device to be discussed hereinafter. Outputs 122, 124 are fed to their associated register flipflops via an EXCLUSIVE-OR-gate. Inputs 104, 102 to the PLA 100 are connected to the address counter 130 to therein invert the address incrementation direction and to activate the retention test waiting time, respectively.

The PLA can be replaced by a piece of combinational logic with the same functionality (e.g. a standard cell realization or a gate matrix). The PLA contains all information about the test algorithm. Hence, if another test algorithm is used, only the PLA needs to be redesigned, or, if applicable, reprogrammed.

Figure 9:
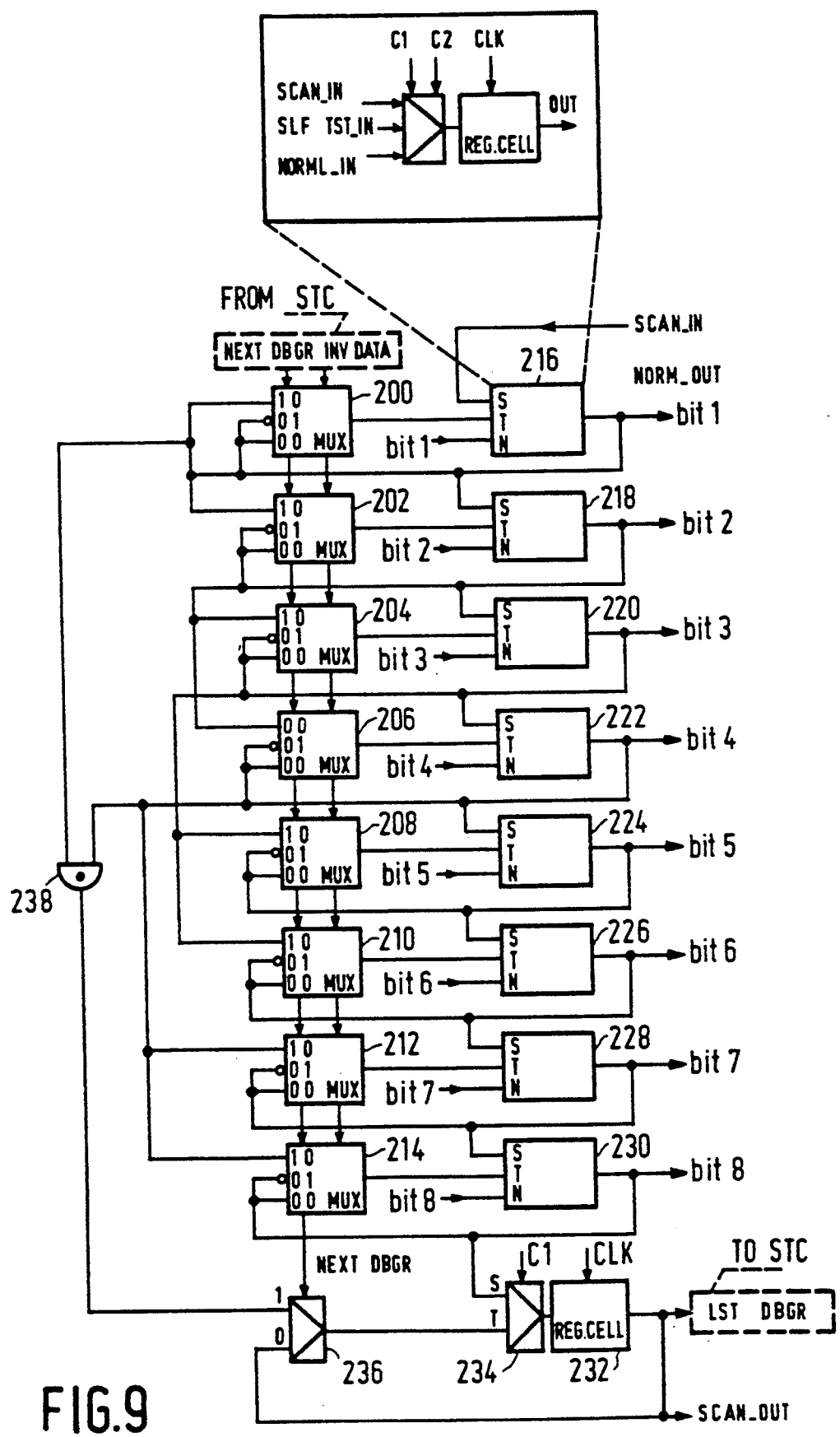
FIG. 9 shows an exemplary circuit realization of the parametrizeable data generator.

FIG. 9 shows an exemplary circuit realization of a parametrizeable data generator. For a data pattern of eight bits this data generator consists of eight stages that each contain a three-input multiplexer (200 ... 214) and a register cell that has been modified according to FIG. 4 (216 ... 230). By way of their S-inputs the latter can constitute part of a serial scan chain. Each input multiplexer feeds a register cell that is connected to the former's output. The register cells in their turn feed their respective input multiplexers as follows: a signal INVDATA=1 and under synchronizing control not shown will invert the data by means of inverting input 01 (indicated by a circle). This implies that all stored data bits are inverted simultaneously. The associated control bit is produced by the arrangement of FIG. 8. The inverted data bit is stored.

Under control of control signal NEXTDBGR=1 the next sequel pattern is stored in the register cells, in that each time the output of register cell j feeds the 10 input of the input multiplexers pertaining to register cell 2j, 2j+1. Therefore: from 216 to 200, 202; from 218 to 204, 206; from 220 to 208, 210; from 222 to 212, 214. The parametrization is easily effected as follows: in going to the double length (b 16 bits), the outputs of register cells 224-230 are fed to the multiplexer inputs of the next following eight states. This implies one additional interconnection for each bit length increase of the pattern.

Under control of two control signals INVDATA=0 and NEXTDBGR=0 the bit present in the respective register cell is retrocoupled to the associated multiplexer input and restored in the register cell. In this way the set-up is made completely synchronously operating. An extended detail of the register cells is shown at the top of the figure. All register cells may feed a data bit input of the memory. Moreover, all register cells, by means of their S-input, may be connected into a serial scan chain.

The combination of control signals NEXTDBGR=1 and INVDATA=1 does not occur. Register cell 230 feeds an additional register cell 232 (provided with a two-input multiplexer 234 and further two-input multiplexer 236). The output of this register cell signals that the last data background has occurred. Multiplexer 234 selects between scanning operation and selftest-operation. Multiplexer 236 selects between the present data background, that is synchronously retrocoupled and restored, and the next data background that is fed to its -1-input under control of control signal NEXTDBGR. The latter is found if bits in cells 216 and 222 have the same sign: then the new pattern is the last data background. This, for an 8-bit background occurs after 3 changes. For an 16 bit pattern, EXCLUSIVE-OR-gate 238 should be fed by the first and eighth register cells. The output of cell 232 is sued for input 110 in FIG. 8. IF the sequel patterns for the data background are produced in another way, the detection of the last data background must be amended in a straightforward way.

On the other hand, the data generator for a bit-oriented memory is particularly simple in that is consists of only a single flipflop plus a few gates. The two required data backgrounds are produced by inverting the flipflop.

FIGS. 10a, b, c, d show an exemplary circuit realization of an eight bit address generator counter and a three bit digital wait counter, plug particularly amended cells for use therein.

The address generator and wait counter are combined in order to reduce silicon overhead. The number of address bits plus the number of wait counter bits, in combination with the clock frequency define the total wait time for the data retention test.

Two possible circuit realizations of the address counter are taken into account: a Linear Feedback Shift Register (LFSR) and a binary up/down counter. The LFSR however has several disadvantages for this purpose:
1. The address scan order cannot be reversed without a significant amount of extra logic.
2. Generation of the all-zero address requires additional hardware.
3. Generation of a carry out signal requires extra logic.

We have chosen a realization with a binary up/down counter since this resulted in a smaller circuit. A problem with the binary counter is the delay of the ripple carry signal. Including the wait counter the number of stages in the counter can be up to 20 bits. We have solved this by designing an up/down counter with a pipelined carry signal. The maximum delay is thus reduced to the delay of a series of four 2-input AND gates.

Thus, all addresses can be generated. There is one address where the sequence may go back. At any address the counting may be halted; the address generation is synchronous. For both counting directions a signal is provided that indicates attainment of the last counting position. The design is parametrizeable. The address counter cells are adapted according to FIG. 10b. The cell proper has an input multiplexer and two additional EXCLUSIVE-OR gates. The multiplexer is controlled by the signal -nextaddr- and -addr.dir- shown at 130 in FIG. 8. The first EXOR-gate under control of the carry-in changes the content of the register cell. The second EXOR-gate of the address incrementation direction signal and the cell's content generates the carry-out signal for the next stage. A string of AND-gates under control of the carry-in and carry-out signals produce the ripple carry signal. The wait counter in this case has three stages shown more extensively in FIG. 10d. These are bit simpler in that they need to count in one direction only. The wait counter represents the more significant bit stages with respect to the address counter.

For speed-up of the counter two pipeline flipflops have been inserted between the strings of ripple AND-gates, which are shown more extensively in FIG. 10c. inasmuch their only function is to isolate the input signal from the output signal, their setup is elementary. Attainment of the last address of an address sequence is signalled by an AND-gate positioned at the output of the eighth stage. This signal is input into input 112 in FIG. 8. The lowest bit position of the wait counter post receives an enable signal from FIG. 3 (block 130). The highest bit position of the wait counter feeds a signal -end of wait- to input 114 in FIG. 8.

In itself, the fast ripple network shown in FIG. 10a has been the subject of Netherlands patent Application 8800860 of Apr. 5, 1988 herein incorporated by reference. For brevity the operation thereof is not discussed further.

FIG. 11 shows an exemplary circuit realization for an eight bit signature generator or data receptor and FIG. 11 a modified register cell therefor.

The data, that is produced by the RAM during the read actions of the test algorithm, goes to the data receptor. There are two principal ways to compare this data with expected data:
1. Compare during every read action the data read with the expected data and set a PASS/FAIL bit if a difference is detected.
2. Compress the data on chip by polynominal division in a Parallel Signature Analyser (PSA). The composited contents of the PSA is called a signature.

We choose the LFSR implementation since this approach results in the least silicon overhead and the delay of an LFSR is small and independent of the number of bits. Various elements may be implemented off-chip or on-chip, as required.

After the selftest has finished, the final signature needs to be compared with a signature that is previously calculated by a dedicated software too. Comparison is done off chip. Therefore the signature needs to be shifted out of the PSA after the test has finished. A hold mode on the PSA is necessary in order to prevent that the final signature in the PSA is lost after the test has finished. The hold control signal is generated in the selftest controller.

The error coverage of the PSA reduces exponentially with the decrease of the number of PSA stages. Hence a minimum of eight PSA stages appears necessary. Normally, the number of PSA stages equals the number of data outputs of the SRAM. If the number of data outputs of the SRAM is smaller than eight, the remaining PSA inputs are connected to Vss.

The Figures show a possible circuit realization for an eight bit PSA. A minimal polynominal is used in the PSA in order to ensure a maximum error coverage and minimal timing problems due to polynominal feedbacks in the PSA. The choice of the seed of the PSA (initialization) is arbitrary. We choose the all zero word for convenience.

FIG. 11a extensively shows the set-up of a single cell. It is provided with the standard storage port, preceded by a multiplexer that selects between test-operation and serial scan operation, and by a second multiplexer that selects between the existing cell contents (via retrocoupling) and a test signal that is controlled by an EXOR-gate. The selection is controlled by the LFSR-enable signal produced by element 142 in FIG. 8. The input EXORs may receive a data bit directly from the RAM. Further EXCLUSIVE OR-gates realize the maximum length feed back register in ways known in the art. The output is serial. In case the RAM has a smaller data width, fewer stages need to be fed by the data output.

We claim:
1. A memory device comprising:
a) a static RAM-memory;

b) an address register, a data input register, a data output register, and a control register all operatively coupled to the RAM for executing accesses to said memory, c) said address, data input and control registers having externally accessible functional interconnections for information communication, d) all said registers comprising respective parts of a serially activatable test scan chain means, and e) first control means for activating said memory device alternatively in a scan-state, an operational state, and an independent self-test state, wherein:

in a said scan-state, said test scan chain mean is operative as at least one serial shift register;

in said operational state, at least said address register, said data input register, and said control register are operatively coupled to the memory; and in said self-test state, during a time when there is an absence of any information communication via any information input of the memory device, said address register, said data input register and said control register are operatively coupled to the memory for autonomously generating successive data test patterns and address test patterns during a plurality of distinct cycles through RAM, and for switching between reading and writing; and said data output register is operative for receiving successive data result patterns and includes conversion means for converting successive data result patterns to a signature pattern;

said address register and data input register being provided with sequencing means for converting an initialization pattern sequentially to a succession of sequel patterns, and wherein said conversion means are operative in synchronism with the generation of said sequel patterns, said data input register being provided with a preset mechanism for in the latter register producing a partial test pattern that has a maximum number of 1-0 changeovers between successive bit positions, and said sequencing means has second control means for from said partial test pattern generating successive further partial test patterns in a partial sequence, wherein in said sequence each 1-0 changeover between a random pair of bit positions thereof occurs at least once.

2. A memory device as claimed in claim 1, wherein said conversion means has a hold state for holding any signature pattern generated therein.

3. A memory device as claimed in claim 1, wherein said serial test scan chain is adapted for executing a test operation on said control means and said sequencing means.

4. A memory device as claimed in claim 1, wherein third control means are provided for executing a scan test on the memory itself.

5. An integrated circuit containing a memory device according to claim 1, and also a further data processing subsystem that in said operational state is operatively connected to at least either said data input register, or said address register, or a functional data output coupled to said data output register.

6. A memory device as claimed in claim 1, wherein said serial test scan chain is adapted for executing a test operation on said first control means and said sequencing means.

7. A memory device comprising:
a) a static RAM-memory;

b) an address register, a data input register, a data output register, and a control register all operatively coupled to the RAM for executing accesses to said memory, c) said address, data input and control registers having externally accessible functional interconnections for information communication, d) all said registers comprising respective parts of a serially activatable test scan chain means, and e) first control means for activating said memory device alternatively in a scan-state, an operational state, and an independent self-test state, wherein:

in a said scan-state, said test scan chain means is operative as at least one serial shift register;

in said operational state, at least said address register, said data input register, and said control register are operatively coupled to the memory; and in said self-test state, during a time when there is an absence of any information communication via any information input of the memory device, said address register, said data input register and said control register are operatively coupled to the memory for autonomously generating successive data test patterns and address test patterns during a plurality of distinct cycles through RAM, and for switching between reading and writing; and said data output register is operative for receiving successive data result patterns and includes conversion means for converting successive data result patterns to a signature pattern;

said address register and data input register being provided with sequencing means for converting an initialization pattern sequentially to a succession of sequel patterns, and wherein said conversion means are operative in synchronism with the generation of said sequel patterns, said first control means including a finite state machine, for producing a plurality of control signals controlling in said test state said RAM-memory and said address register, the finite state machine comprising means for driving the plurality of control signals in a succession of control states, a successive control state being determined from a preceding control state and an address register state, said finite state machine including a sequence of states, starting with a write state for all memory locations, followed by a first read-modify sequence for all memory locations in a first address incrementation direction with a first data background, repeating the same with an inverted data background with respect to said first data background, repeating the same in an opposite address incrementation direction with said first and inverted data backgrounds, respectively, next disabling the memory during a waiting time and thereafter executing a second read-modify sequence for all memory locations in predetermined address incrementation sequence, finally disabling the memory again during a time equal to said waiting time and execute a read sequence for all memory locations in a further predetermined address sequence;

said first and second data backgrounds comprise a plural bit-repetition of (0-1) data patterns to a total n n-bits, and in that any state pertaining to such data background is replayed in a state with a projected data background, wherein half of the data bits of any projecting data background are each projected on two bits of the projected data background, until after $^2$log n replay operations, any pair of data bits has at least once had a (0-1) pattern difference between them.

8. A memory device comprising:
a) a static RAM-memory;
b) an address register, a data input register, a data output register, and a control register all operatively coupled to the RAM for executing accesses to said memory,
c) said address, data input and control registers having externally accessible functional interconnections for information communication,
d) all said registers comprising respective parts of serially activatable test scan chain means, and
e) first control means for activating said memory device alternatively in a scan-state, an operational state, and an independent self-test state, wherein:
in a said scan-state, said test scan chain means is operative as at least one serial shift register;
in said operational state, at least said address register, said data input register, and said control register are operatively coupled to the memory;
in said self-test state, during a time when there is an absence of any information communication via any information input of the memory device, said address register, said data input register and said control register are operatively coupled to the memory for autonomously generating successive data test patterns and address test patterns during a plurality of distinct cycles through RAM, and for switching between reading and writing; and said data output register is operative for receiving successive data result patterns and includes conversion means for converting successive data result patterns to a signature pattern;
said address register and data input register being provided with sequencing means for converting an initialization pattern sequentially to a succession of sequel patterns, and wherein said conversion means are operative in synchronism with the generation of said sequel patterns;
said data input register being provided with a preset mechanism for in the latter register producing a partial test pattern that has a maximum number of 1-0 changeovers between successive bit positions, and said sequencing means has second control means for from said partial test pattern generating successive further partial test patterns in a partial sequence, wherein in said sequence each 1-0 changeover between a random pair of bit positions thereof occurs at least once; and
wherein said first control means comprises a finite state machine, for producing a plurality of control signals controlling in said test state said RAM-memory and said address register, the finite state machine comprising means for driving the plurality of control signals in a succession of control states, a successive control state being determined from a preceding control state and an address register state.

9. A memory device as claimed in claim 8, wherein said finite state machine comprises a sequence of states, starting with a write state for all memory locations, followed by a first read-modify sequence for all memory locations in a first address incrementation direction with a first data background, repeating the same with an inverted data background with respect to said first data background, repeating the same in an opposite address incrementation direction with said first and inverted data backgrounds, respectively, next disabling the memory during a waiting time and thereafter executing a second read-modify sequence for all memory locations in a predetermined address incrementation sequence, finally disabling the memory again during a time equal to said waiting time and execute a read sequence for all memory locations in a further predetermined address sequence.

10. A memory device as claimed in claim 9, wherein each said first read-modify sequence is completed to a read-modify-read sequence.

11. A memory device as claimed in claim 8, wherein said address register has address traversing means, for traversing all address positions of the memory in a first sequence, the address register also having reverse traversing means, for traversing all the address positions in a second sequence, the second sequence being in reverse order with respect to the first sequence.

12. A memory device as claimed in claim 11, wherein the traversing means are counting means, the first sequence being in order of successive address positions.

13. A memory device as claimed in claim 8, wherein each said data result pattern comprises a plurality of bits, said plurality of bits being coupled in parallel to a linear feedback shift register, which is comprised in said conversion means.

14. A memory device as claimed in claim 11, wherein said linear feedback shift register comprises a number of shift stages, the number of shift stages being larger than a number of bits in said plurality of bits.

15. A memory device comprising:
a) a static RAM-memory;
b) an address register, a data input register, a data output register, and a control register, all operatively coupled to the RAM for executing accesses to said memory,
c) said address, data input and control registers having externally accessible functional interconnections for information communication,
d) all said registers comprising respective parts of a serially activatable test scan chain means,
e) first control means for activating said memory device alternatively in a scan-state, an operational state, and an independent self-test state, wherein:
in a said scan-state, said test scan chain mean is operative as at least one serial shift register;
in said operational state, at least said address register, said data input register, and said control register are operatively coupled to the memory;
in said self-test state, during at time when there is an absence of any information communication via any information input of the memory device, said address register, said data input register and said control register are operatively coupled to the memory for autonomously generating successive data test patterns and address test patterns during a plurality of distinct cycles through RAM, and for switching between reading and writing; and said data output register is operative for receiving successive data result patterns and includes conversion means for converting successive data result patterns to a signature pattern; and
waiting means for waiting a predetermined period of time longer than a plurality of clock cycles between writing and reading accesses at an address, no writing accesses being executed in said predetermined period.

16. A memory device as claimed in claim 15, wherein the waiting means comprises a wait counter, said wait counter sharing at least a part of the counting means.

* * * * *